(12) United States Patent
Wu

(10) Patent No.: US 7,795,923 B1
(45) Date of Patent: Sep. 14, 2010

(54) LOGIC CIRCUIT

(75) Inventor: Tsung-Yi Wu, Changhua (TW)

(73) Assignee: National Changhua University of Education, Changhua, Changhua County (TW)

( * ) Notice: Subject to any disclaimer, the term of this patent is extended or adjusted under 35 U.S.C. 154(b) by 0 days.

(21) Appl. No.: 12/578,538

(22) Filed: Oct. 13, 2009

(51) Int. Cl.
*H03K 19/20* (2006.01)
*H03K 19/094* (2006.01)

(52) U.S. Cl. .................. 326/113; 326/104; 326/112; 326/119

(58) Field of Classification Search ............... 326/104, 326/112–113, 119, 121
See application file for complete search history.

(56) References Cited

U.S. PATENT DOCUMENTS 6,084,437 A * 7/2000 Sako .................... 326/113
2002/0180486 A1* 12/2002 Yamashita et al. ........ 326/113

OTHER PUBLICATIONS

Wu et al., Low-Leakage and Low-Power Implementation of High-Speed 65nm Logic Gates, (2008 IEEE) National Changhua University of Education, 4pgs.
Wu et al., Low-Leakage and Low-Power Implementation of High-Speed Logic Gates, (Apr. 2009), IEICE Trans Electron, vol. E92-C No. 4, pp. 401-408.

\* cited by examiner

*Primary Examiner*—Anh Q Tran
(74) *Attorney, Agent, or Firm*—Knobbe Martens Olson & Bear LLP

(57) ABSTRACT

A logic circuit includes first, second, third and fourth transistors. The first transistor is a first type, and has a gate terminal for receiving a control signal representative of one of NAND and NOR operations of at least first and second signals, a first terminal coupled to a first power source, and a second terminal serving as an output terminal of the logic circuit. The second transistor is a second type, and has a first terminal for receiving a third signal, and gate and second terminals respectively coupled to the gate and second terminals of the first transistor. Each of the third and fourth transistors is the first type and has a gate terminal. The gate terminals of the third and fourth transistors are respectively adapted to receive the first and second signals. The series-connected third and fourth transistors are connected in parallel to the second transistor.

9 Claims, 5 Drawing Sheets

LOGIC CIRCUIT

BACKGROUND OF THE INVENTION

1. Field of the Invention

This invention relates to a logic circuit, more particularly to a logic circuit with a low leakage current.

2. Description of the Related Art

Referring to FIG. 1, a conventional three-input complementary metal-oxide-semiconductor (CMOS) AND logic circuit 1 includes a NAND logic gate 11 which is adapted to perform a NAND operation on three input signals (A, B, C) so as to generate a control signal ($\overline{ABC}$), and an inverting logic gate 12 which is adapted to perform an inversion operation on the control signal ($\overline{ABC}$) so as to generate an output signal (ABC) that is representative of an AND operation of the input signals (A, B, C).

The NAND logic gate 11 includes three series-connected n-type metal-oxide-semiconductor field-effect transistors (NMOS transistors) 111, 112, 113 adapted to be coupled between a low voltage source 21 and three parallel-connected p-type metal-oxide-semiconductor field-effect transistors (PMOS transistors) 114,115,116. The parallel-connected PMOS transistors 114, 115, 116 are adapted to be coupled between a high voltage source 22 and the series-connected NMOS transistors 1111, 112, 113. A node of connection between the series-connected NMOS transistors 111, 112, 113 and the parallel-connected PMOS transistors 114, 115, 116 serves as an output terminal of the NAND logic gate 11. The inverting logic gate 12 includes an NMOS transistor 121 and a PMOS transistor 122 that are connected in series between the low and high voltage sources 21, 22. Gate terminals of the NMOS and PMOS transistors 121, 122 are coupled to the output terminal of the NAND logic gate 11. A node of connection between the NMOS and PMOS transistors 121, 122 serves as an output terminal of the conventional three-input CMOS AND logic circuit 1.

As dimensions of CMOS devices continue to scale down, the problem of leakage current in conventional CMOS logic circuits, such as the aforesaid conventional three-input CMOS AND logic circuit 1, gets worse. Hence, there is a need to design a logic circuit that has a relatively lower leakage current, while performing the same function as the conventional logic circuit.

SUMMARY OF THE INVENTION

Therefore, the object of the present invention is to provide a logic circuit that can overcome the aforesaid drawback associated with the prior art.

According to this invention, there is provided a logic circuit that includes a first transistor, a second transistor, and series-connected third and fourth transistors. The first transistor is a first type, and has a gate terminal that is adapted for receiving a control signal which is representative of one of NAND and NOR operations of at least first and second signals, a first terminal that is adapted to be coupled to a first power source, and a second terminal serving as an output terminal of the logic circuit. The second transistor is a second type, and has a gate terminal that is coupled to the gate terminal of the first transistor, a first terminal that is adapted for receiving a third signal, and a second terminal that is coupled to the second terminal of the first transistor. Each of the series-connected third and fourth transistors is the first type and has a gate terminal. The gate terminals of the third and fourth transistors are respectively adapted for receiving the first and second signals. The series-connected third and fourth transistors are connected in parallel to the second transistor.

BRIEF DESCRIPTION OF THE DRAWING

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
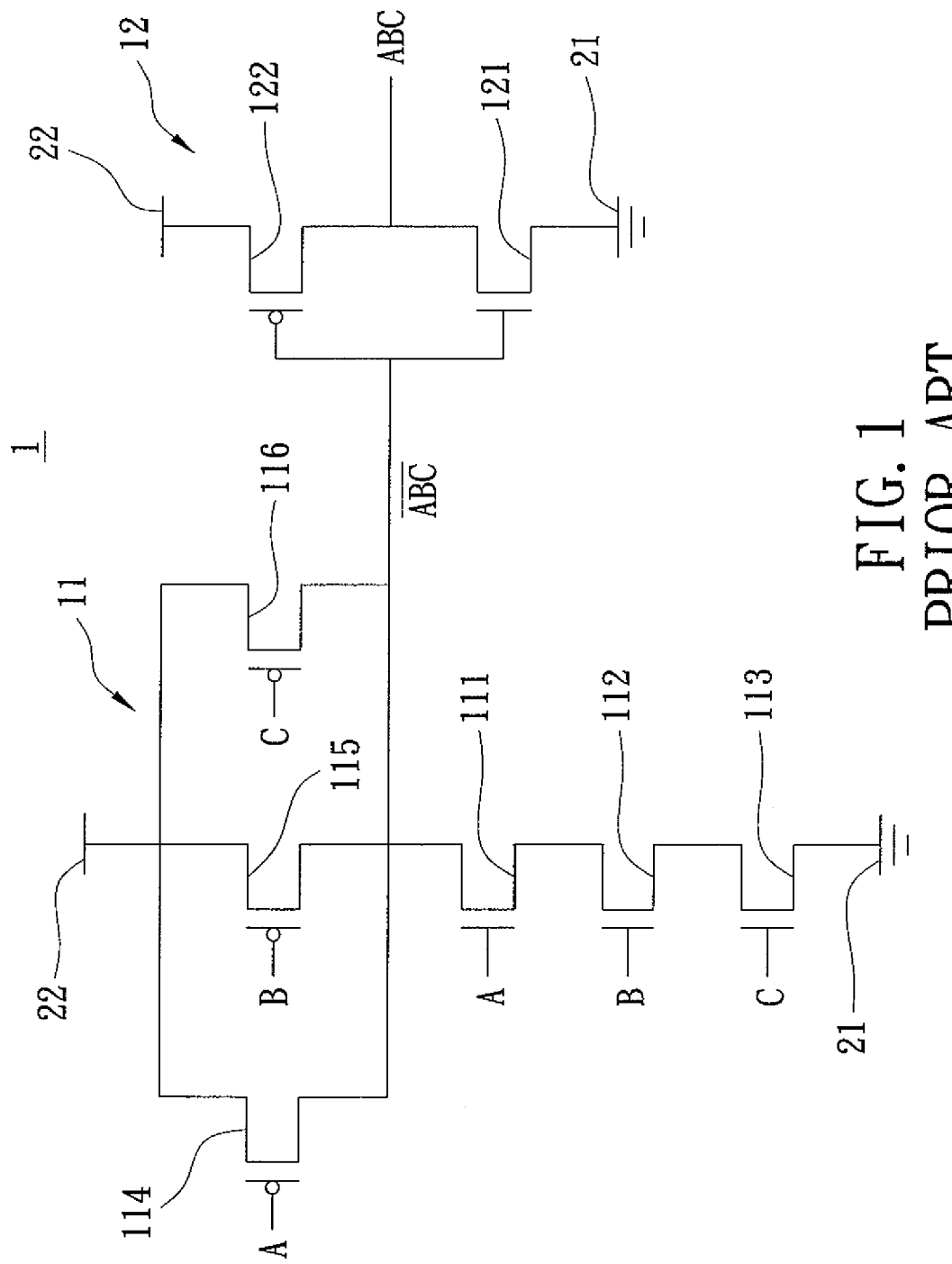
FIG. 1 is a schematic diagram of a conventional three-input CMOS AND logic circuit.

Before the present invention is described in greater detail with reference to the accompanying preferred embodiments, it should be noted herein that like elements are denoted by the same reference numerals throughout the disclosure.

The inventor found that the high leakage current in the conventional CMOS logic circuits, such as the aforesaid conventional three-input AND logic circuit 1 (as shown in FIG. 1), is attributed to the inverting logic gate 12. Hence, a logic circuit that is able to perform the same function as the conventional logic circuit without the use of the inverting logic gate 12 (shown in FIG. 1) is provided according to this invention.

Figure 2:
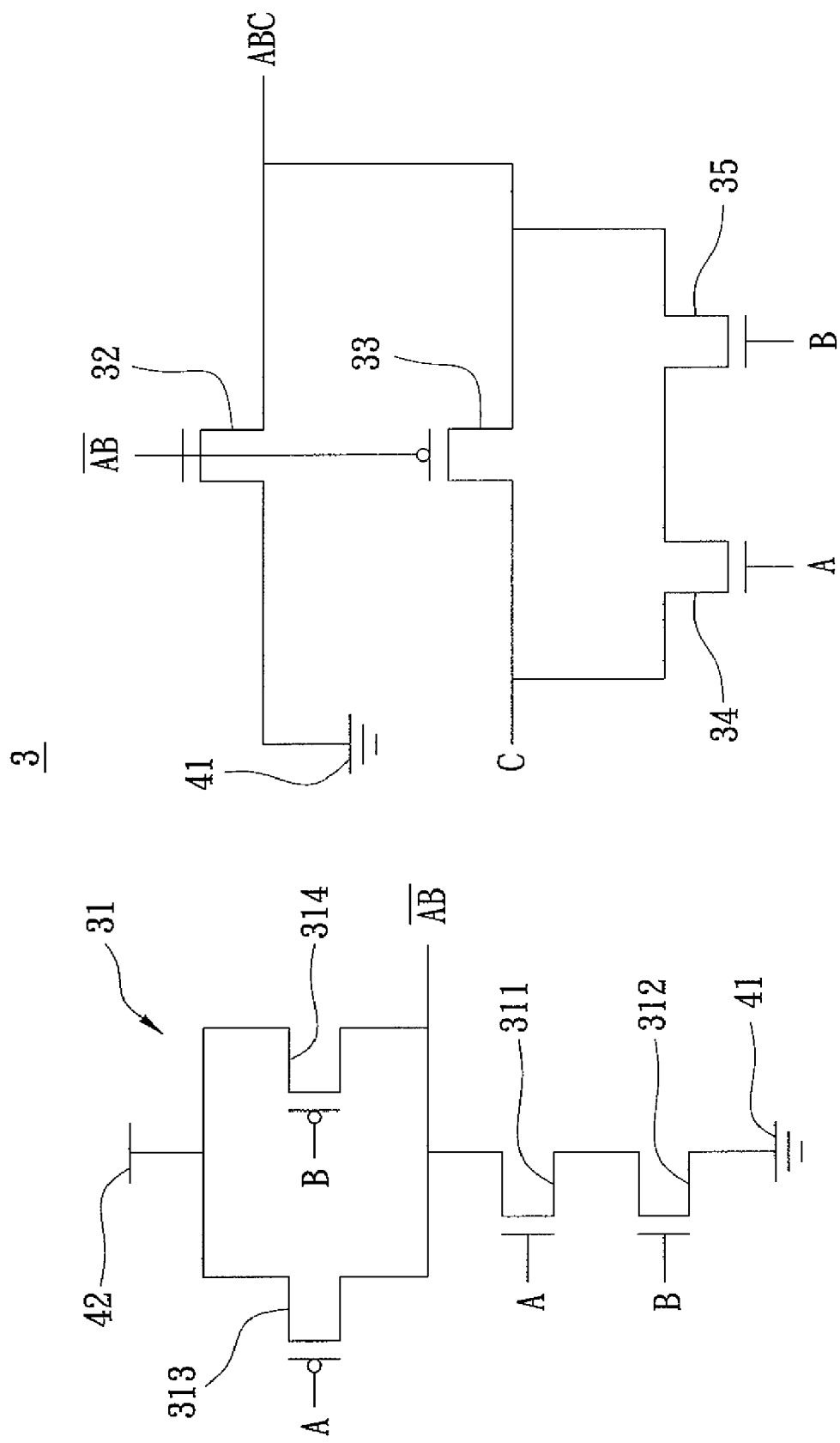
FIG. 2 is a schematic diagram of the first preferred embodiment of a logic circuit according to this invention.

Referring to FIG. 2, the first preferred embodiment of a logic circuit 3 according to this invention is adapted to generate an output signal (ABC) that is representative of an AND operation of first, second, and third signals (A, B, C), and includes a logic gate 31, a first transistor 32, a second transistor 33, and series-connected third and fourth transistors 34, 35.

The logic gate 31 is adapted to receive the first and second signals (A, B), and generate a control signal ($\overline{AB}$) that is representative of a NAND operation of the first and second signals (A, B).

The first transistor 32 is an NMOS transistor, and has a gate terminal that is coupled to the logic gate 31 for receiving the control signal ($\overline{AB}$) therefrom, a first terminal that is coupled to a first power source 41, and a second terminal serving as an output terminal of the logic circuit 3 for outputting the output signal (ABC).

The second transistor 33 is a PMOS transistor, and has a gate terminal that is coupled to the gate terminal of the first transistor 32, a first terminal that is adapted for receiving the third signal (C), and a second terminal that is coupled to the second terminal of the first transistor 32.

Each of the series-connected third and fourth transistors 34, 35 is an NMOS transistor and has a gate terminal. The gate terminals of the third and fourth transistors 34, 35 are respectively adapted for receiving the first and second signals (A, B). The series-connected third and fourth transistors 34, 35 are connected in parallel to the second transistor 33.

The logic gate 31 includes series-connected fifth and sixth transistors 311, 312 and parallel-connected seventh and eighth transistors 313, 314. Each of the fifth and sixth transistors 311, 312 is an NMOS transistor and has a gate terminal. Each of the seventh and eighth transistors 313, 314 is a PMOS transistor and has a gate terminal. The series-connected fifth and sixth transistors 311, 312 are adapted to be coupled between the first power source 41 and the gate terminal of the first transistor 32. The parallel-connected seventh and eighth transistors 313, 314 are adapted to be coupled between a second power source 42 and the gate terminal of the first transistor 32. The gate terminal of each of the fifth and seventh transistors 311, 313 is adapted for receiving the first signal (A). The gate terminal of each of the sixth and eighth transistors 312, 314 is adapted for receiving the second signal (B).

In this embodiment, the first and second power sources 41, 42 are respectively at low and high voltage levels.

Figure 3:
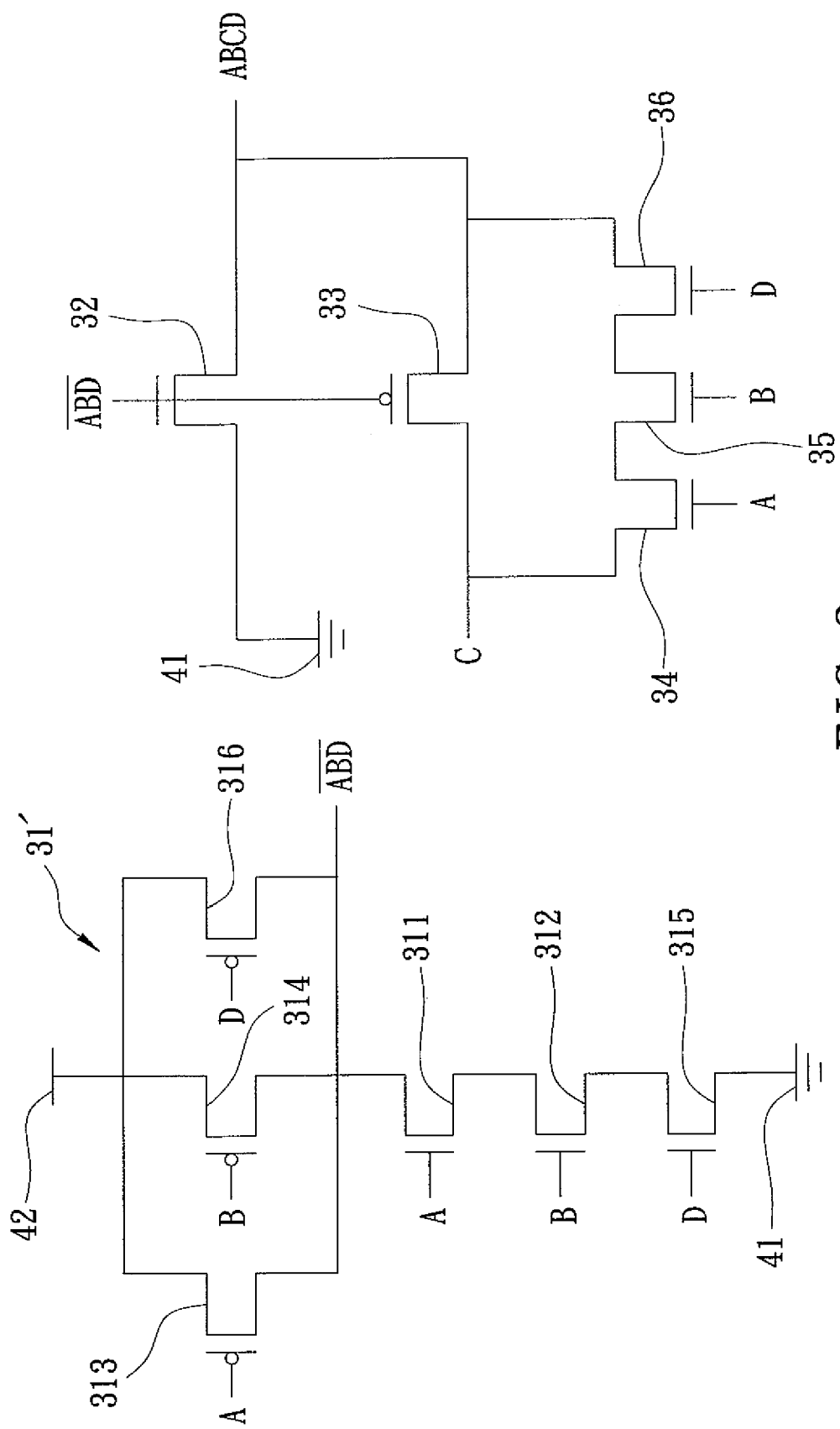
FIG. 3 is a schematic diagram of the second preferred embodiment of a logic circuit according to this invention.

Referring to FIG. 3, the second preferred embodiment of a logic circuit according to this invention is adapted to generate an output signal (ABCD) that is representative of an AND operation of first, second, third, and fourth signals (A, B, C, D). The second preferred embodiment differs from the previous preferred embodiment in that the logic circuit of the second preferred embodiment further includes a ninth transistor 36, and that the logic gate 31' of the second preferred embodiment is further adapted for receiving the fourth signal (D) such that the control signal ($\overline{ABD}$) generated thereby is representative of a NAND operation of the first, second and fourth signals (A, B, D).

In this embodiment, the ninth transistor 36 is an NMOS transistor, is connected in series to the third and fourth transistors 34, 35, and has a gate terminal adapted for receiving the fourth signal (D). The series-connected third, fourth and ninth transistors 34, 35, 36 are coupled in parallel to the second transistor 33. The logic gate 31' further includes tenth and eleventh transistors 315, 316. The tenth transistor 315 is an NMOS transistor, is connected in series to the fifth and sixth transistors 311, 312, and has a gate terminal adapted for receiving the fourth signal (D). The series-connected fifth, sixth and tenth transistors 311, 312, 315 are adapted to be coupled between the first power source 41 and the gate terminal of the first transistor 32. The eleventh transistor 316 is a PMOS transistor, is connected in parallel to the seventh and eighth transistors 313, 314, and has a gate terminal adapted for receiving the fourth signal (D). The parallel-connected seventh, eighth and eleventh transistors 313, 314, 316 are adapted to be coupled between the second power source 42 and the gate terminal of the first transistor 32.

Figure 4:
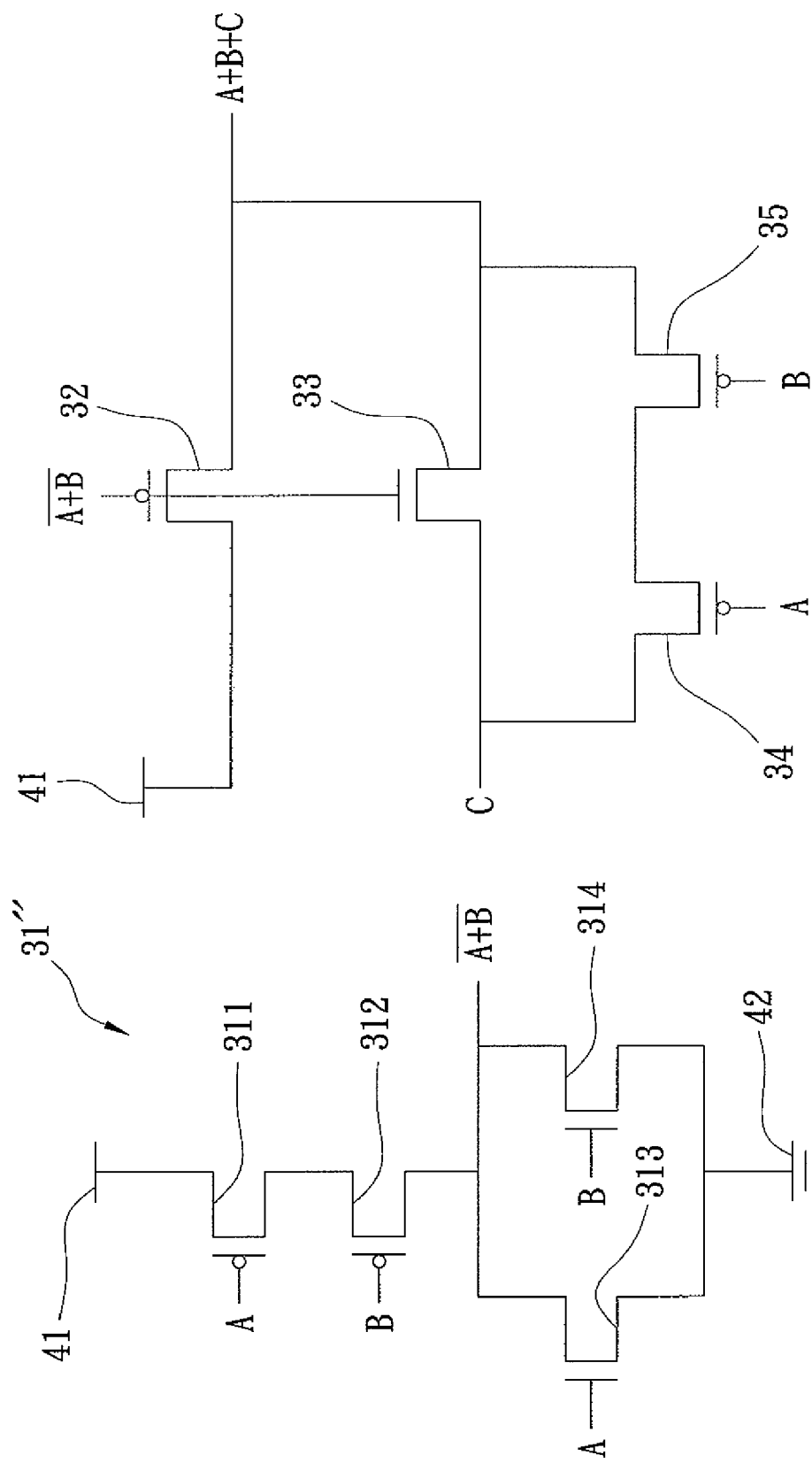
FIG. 4 is a schematic diagram of the third preferred embodiment of a logic circuit according to this invention.

Referring to FIG. 4, the third preferred embodiment of a logic circuit according to this invention is adapted to generate an output signal (A+B+C) that is representative of an OR operation of first, second and third signals (A, B, C). The third preferred embodiment differs from the first preferred embodiment in that the first, third, fourth, fifth and sixth transistors 32, 34, 35, 311, 312 of the third preferred embodiment are PMOS transistors, that the second, seventh and eighth transistors 33, 313, 314 of the third preferred embodiment are NMOS transistors, that the first and second power sources 41, 42 are respectively at the high and low voltage levels, and that the control signal ($\overline{A+B}$) generated by the logic circuit 31'' is representative of a NOR operation of the first and second signals (A, B).

Figure 5:
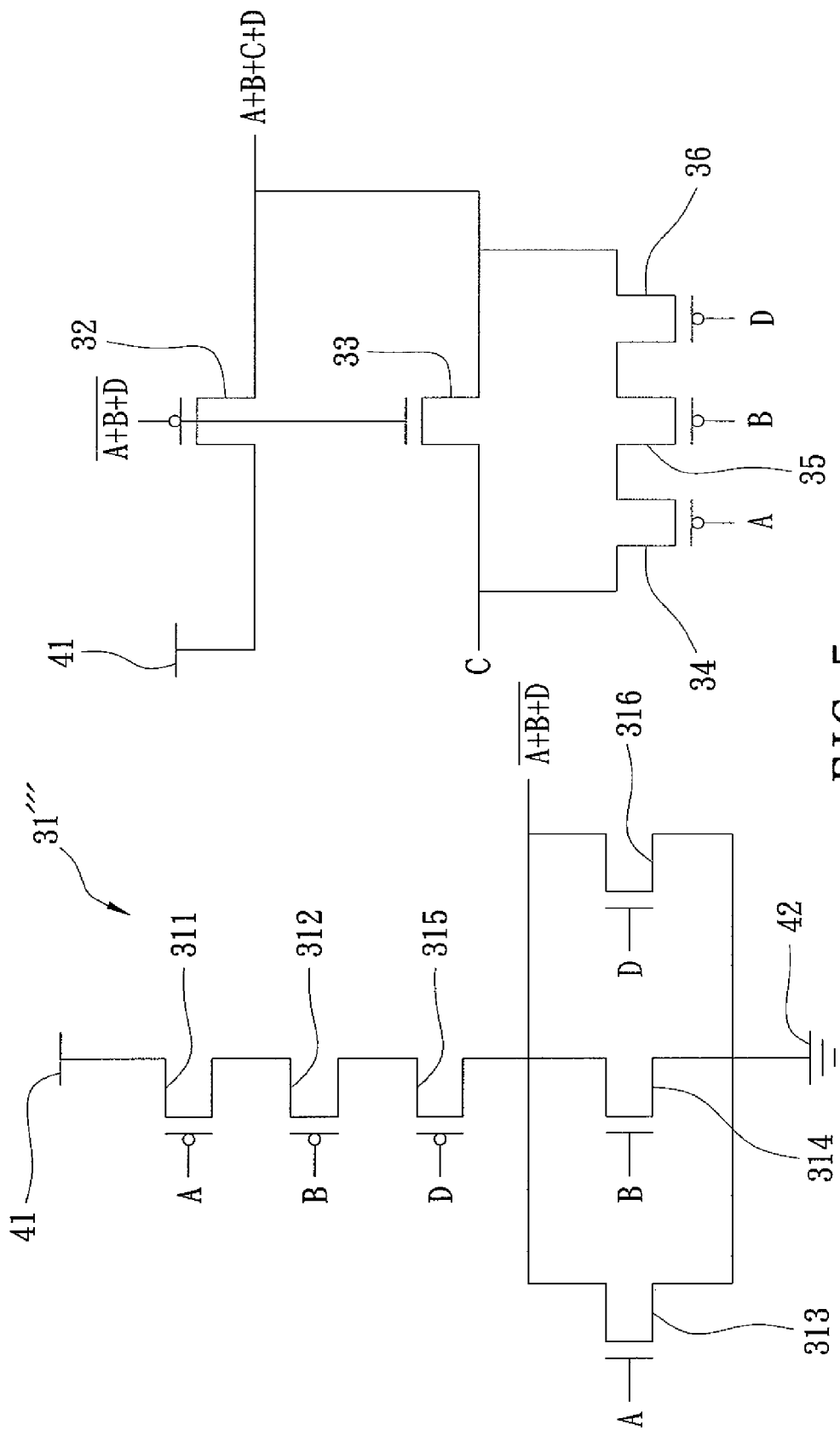
FIG. 5 is a schematic diagram of the fourth preferred embodiment of a logic circuit according to this invention.

Referring to FIG. 5, the fourth preferred embodiment of a logic circuit according to this invention is adapted to generate an output signal (A+B+C+D) that is representative of an OR operation of first, second, third and fourth signals (A, B, C, D). The fourth preferred embodiment differs from the second preferred embodiment in that the first, third, fourth, ninth, fifth, sixth and tenth transistors of the fourth preferred embodiment 32, 34-36, 311, 312, 315 are PMOS transistors, that the second, seventh, eighth and eleventh transistors 33, 313, 314, 316 are NMOS transistors, that the first and second power sources 41, 42 are respectively at high and low voltage levels, and that the control signal ($\overline{A+B+D}$) generated by the logic circuit 31''' is representative of a NOR operation of the first, second and fourth signals (A, B, D).

It is noted that, for each of the transistors 32~36, 311~316, the first terminal is one of drain and source terminals, and the second terminal is the other of the drain and source terminals.

In sum, the logic circuit of this invention utilizes a combination of MOS transistors without the use of a conventional inverting logic gate 12 (shown in FIG. 1) to thereby eliminate the aforesaid high leakage current problem resulting from the use of the conventional inverting logic gate 12.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A logic circuit comprising:
   a first transistor being a first type, and having a gate terminal that is adapted for receiving a control signal which is representative of one of NAND and NOR operations of at least first and second signals, a first terminal that is adapted to be coupled to a first power source, and a second terminal serving as an output terminal of the logic circuit;
   a second transistor being a second type, and having a gate terminal that is coupled to said gate terminal of said first transistor, a first terminal that is adapted for receiving a third signal, and a second terminal that is coupled to said second terminal of said first transistor; and
   series-connected third and fourth transistors, each being the first type and having a gate terminal, said gate terminals of said third and fourth transistors being respectively adapted for receiving the first and second signals, said series-connected third and fourth transistors being connected in parallel to said second transistor.

2. The logic circuit of claim 1, further comprising a logic gate adapted for receiving the first and second signals, and generating the control signal according to the first and second signals.

3. The logic circuit of claim 2, wherein said logic gate includes series-connected fifth and sixth transistors and parallel-connected seventh and eighth transistors, each of said fifth and sixth transistors being the first type and having a gate terminal, each of said seventh and eighth transistors being the second type and having a gate terminal, said series-connected fifth and sixth transistors being adapted to be coupled between the first power source and said gate terminal of said first transistor, said parallel-connected seventh and eighth transistors being adapted to be coupled between a second power source and said gate terminal of said first transistor, said gate terminal of each of said fifth and seventh transistors being adapted for receiving the first signal, said gate terminal of each of said sixth and eighth transistors being adapted for receiving the second signal.

4. The logic circuit of claim 2, wherein the first type is n-type, the second type being p-type.

5. The logic circuit of claim 3, wherein the first power source is at a low voltage level, and the second power source is at a high voltage level.

6. The logic circuit of claim 2, wherein the first type is p-type, the second type being n-type.

7. The logic circuit of claim 5, wherein the first power source is at a high voltage level, and the second power source is at a low voltage level.

8. The logic circuit of claim 1, wherein the control signal is representative of one of NAND and NOR operations of the first and second signals and a fourth signal.

9. The logic circuit of claim 7, further comprising a logic gate adapted for receiving the first, second, and fourth signals, and generating the control signal according to the first, second, and fourth signals, said logic circuit further comprising a ninth transistor that is the first type, that is connected in series to said third and fourth transistors, and that has a gate terminal adapted for receiving the fourth signal, said series-connected third, fourth and ninth transistors being coupled in parallel to said second transistor.

\* \* \* \* \*